(12) United States Patent
Sugino et al.

(10) Patent No.: US 9,252,221 B2
(45) Date of Patent: Feb. 2, 2016

(54) FORMATION OF GATE SIDEWALL STRUCTURE

(71) Applicant: Spansion LLC, Sunnyvale, CA (US)

(72) Inventors: Rinji Sugino, San Jose, CA (US); Scott Bell, San Jose, CA (US); Chun Chen, San Jose, CA (US); Shenging Fang, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 18 days.

(21) Appl. No.: 14/143,317

(22) Filed: Dec. 30, 2013

(65) Prior Publication Data

US 2015/0187891 A1 Jul. 2, 2015

(51) Int. Cl.
*H01L 29/40* (2006.01)
*H01L 29/51* (2006.01)
*H01L 29/423* (2006.01)

(52) U.S. Cl.
CPC ........ *H01L 29/401* (2013.01); *H01L 29/42344* (2013.01); *H01L 29/512* (2013.01); *H01L 29/518* (2013.01)

(58) Field of Classification Search
CPC ..................................................... H01I 27/115
See application file for complete search history.

(56) References Cited

U.S. PATENT DOCUMENTS

| 4,417,385 | A | * | 11/1983 | Temple | 438/138 |
| 5,869,379 | A | * | 2/1999 | Gardner et al. | 438/305 |
| 2014/0175533 | A1 | * | 6/2014 | Kwon | 257/324 |

* cited by examiner

*Primary Examiner* — Mamadou Diallo

(57) ABSTRACT

A semiconductor device having a gate stack on a substrate is disclosed. The gate stack may include a mask layer disposed over a first gate conductor layer. The first gate conductor layer may be laterally etched beneath the mask layer to create an overhanging portion of the mask layer. A sidewall dielectric can be formed on the sidewall of the first gate conductor layer beneath the overhanging portion of the mask layer. A sidewall structure layer can be formed adjacent to the sidewall dielectric and beneath the overhanging portion of the mask layer. The mask layer can be removed. The first gate conductor layer can be used to form a memory gate and the sidewall structure layer can be used to form a select gate.

9 Claims, 21 Drawing Sheets

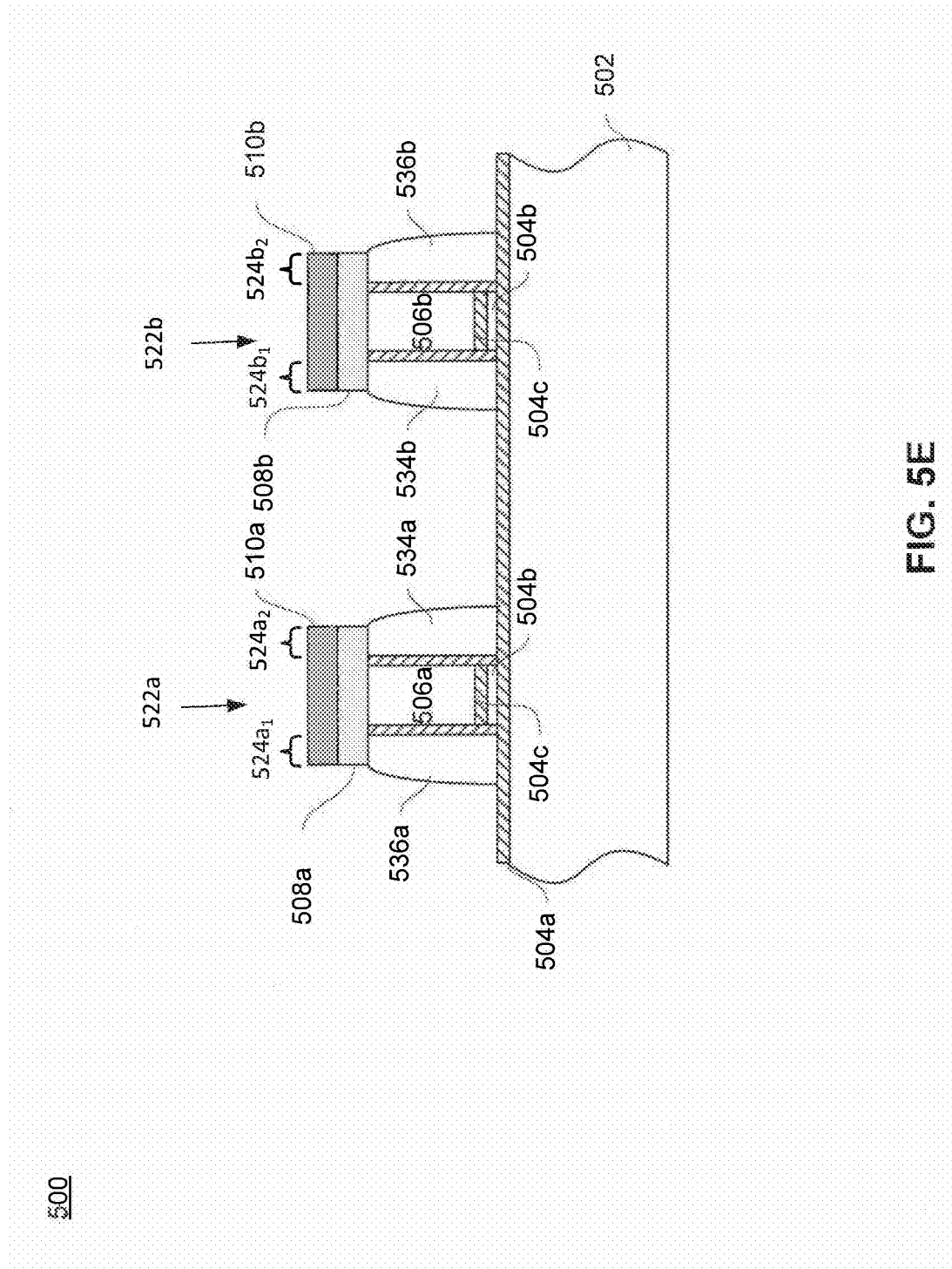

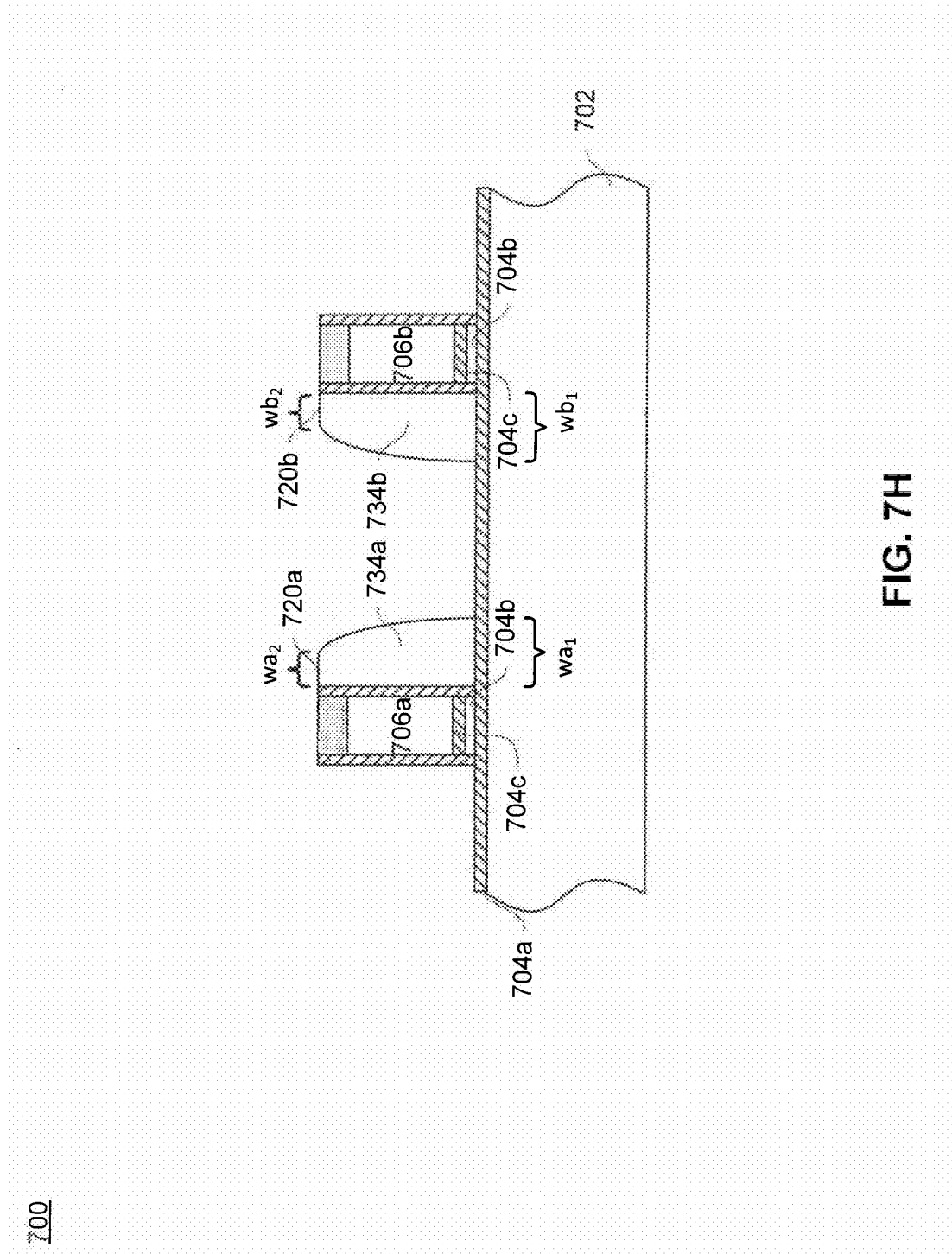

FORMATION OF GATE SIDEWALL STRUCTURE

BACKGROUND

1. Technical Field

This disclosure relates generally to improved semiconductor devices and methods for making such devices.

2. Related Art

Semiconductor devices typically include a number of gate with structures formed on their sidewalls. The sidewall structures might include sidewall spacers, other semiconducting structures, or other device components. In the past, these sidewall structures have been formed by depositing the material over the gate and etching it so that only the portion of the material on the sidewall of the gate remains. While effective, this method can result in a non-uniform sidewall structure. For instance, sidewall structures created in this way will typically be narrower at the top than at the bottom. If the sidewall structure is being used as a dielectric, this can mean that gate-to-gate leakage can occur where the sidewall structure is narrow. Similarly, if the sidewall structure is conductive, the narrow point of the structure can cause insufficient conductivity or high resistance. These effects become more pronounced as gate sizes decrease. What is needed is needed are semiconductor devices and methods for manufacturing them that result sidewall structures without the uneven geometry that do not suffer the same leakage/conductivity issues.

BRIEF SUMMARY OF THE INVENTION

According to various embodiments, a method of making a semiconductor device is described. According to the method a gate stack is formed on a substrate. The gate stack may include a mask layer disposed over a first conductor layer and a dielectric disposed between the first gate conductor layer and the substrate. The first gate conductor layer can be etched so that an overhanging portion of the mask layer overhangs the first conductor layer. Additionally, a sidewall dielectric can be formed on a sidewall of the first conductor layer beneath the overhanging portion of the mask layer. A sidewall structure layer can be formed adjacent to the sidewall dielectric and beneath the overhanging portion of the mask layer. Finally, the mask layer can be removed from the sidewall structure layer and the top of the first conductor layer.

A semiconductor device is also described. The semiconductor device may include a substrate, a first gate structure, a sidewall dielectric and a sidewall structure. The first gate structure may comprise a first gate conducting layer and a dielectric disposed over the substrate. The sidewall dielectric may be disposed on a sidewall of the first gate structure. The sidewall structure may comprise a second gate conducting layer disposed adjacent to the sidewall dielectric and include a substantially flat top portion.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIGS. 5A-5H depict a cross section of a semiconductor device at various points during its manufacture according to embodiments.

FIGS. 7A-7H depict a cross section of a semiconductor device at various points during its manufacture according to embodiments.

Figure 1:
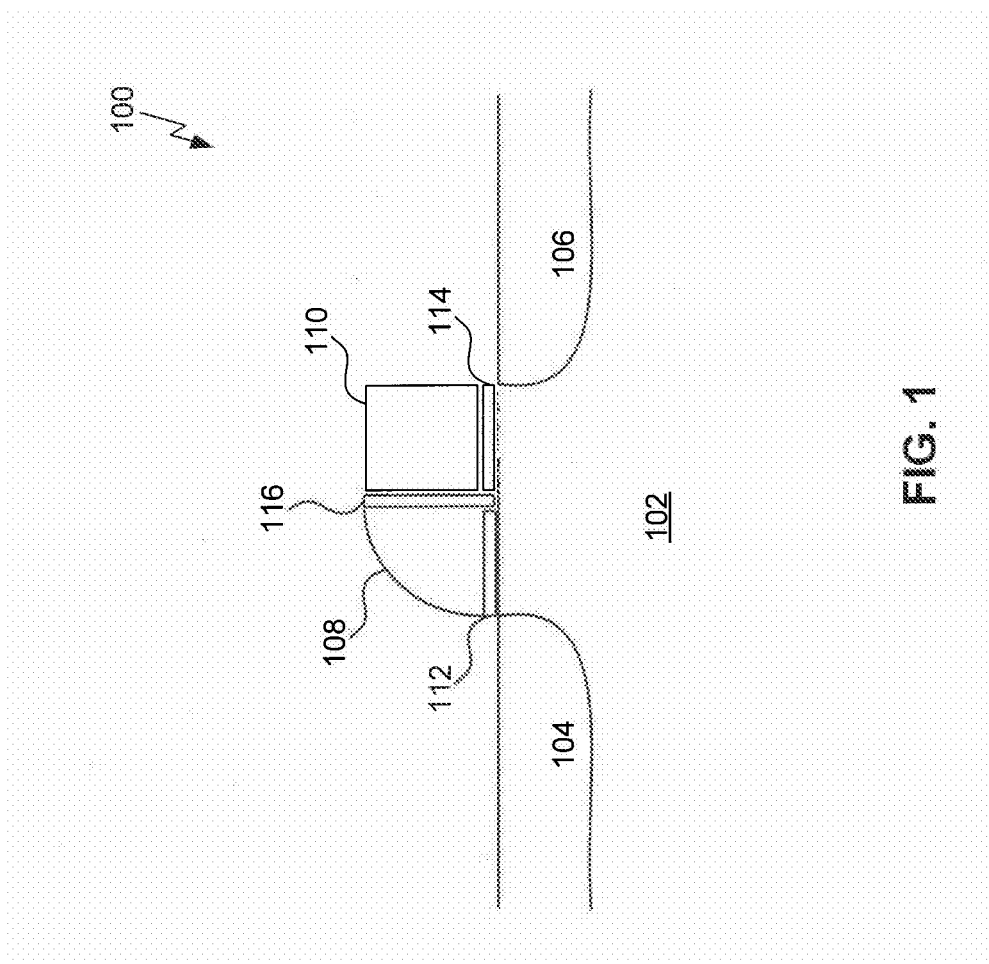
FIG. 1 depicts a cross-section of a split-gate memory cell according to various embodiments.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Before describing such embodiments in more detail, it is instructive to present an example memory cell and environment in which the present embodiments may be implemented.

FIG. 1 illustrates an example a semiconducting device with a structure formed on the sidewall of a gate. In this case, FIG. 1 depicts of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108, which is formed on the sidewall of a memory gate 110. Each gate may comprise a gate conductor such as a doped poly layer formed by well known, for example, deposit and etch techniques to define the gate structure. Select gate 108 is disposed over a dielectric layer 112. Memory gate 110 is disposed over a dielectric 114 having one or more dielectric layers. In one example, dielectric 114 includes a charge trapping silicon nitride layer sandwiched between two silicon dioxide layers to create a three-layer stack collectively and commonly referred to as "ONO." Other dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and dielectric 114 are the same dielectric, while other examples form one dielectric before the other (e.g., they can have different dielectric properties.) As such, vertical dielectric 116 need not include the same film structure as dielectric 114. regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

As can be seen from FIG. 1, the select gate 108 is formed on the sidewall of memory gate 110 such that it is narrower at the top than it is at the bottom. This can result, in some instances, in decreased conductivity or high resistance between in the device 100 when it is "on."

Figure 2:
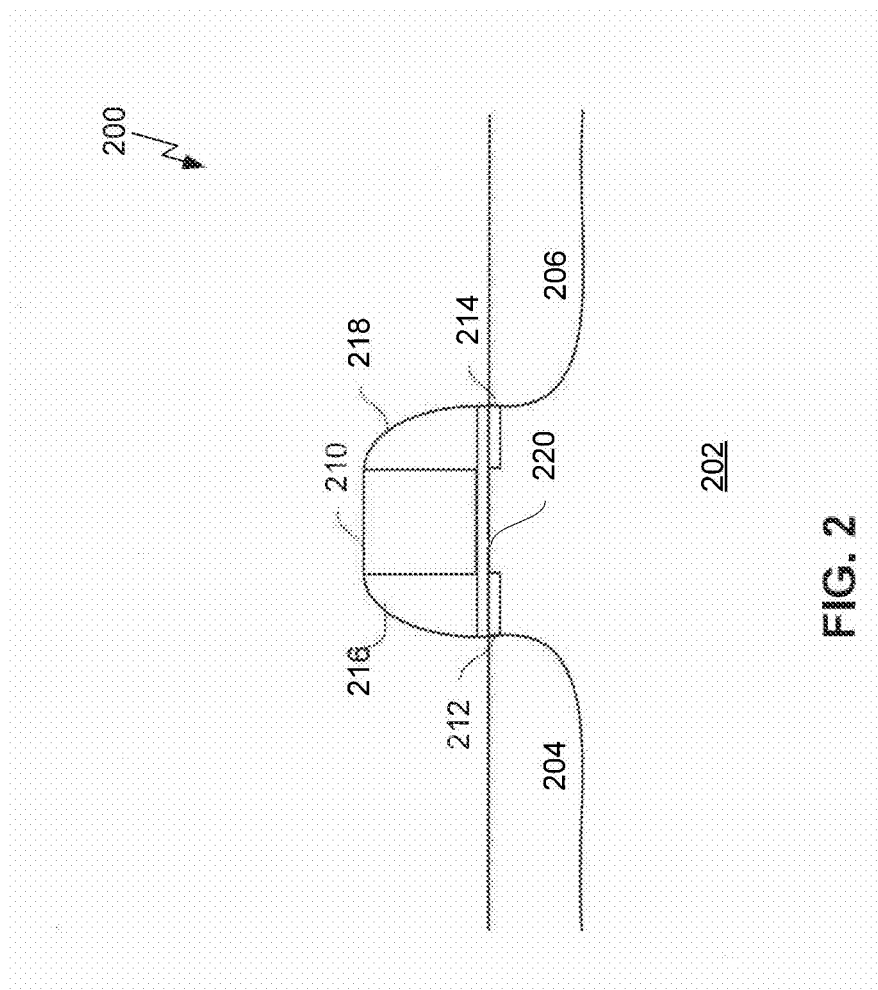
FIG. 2 depicts a gate with sidewall spacer structures according to various embodiments.

FIG. 2 illustrates an alternative example of a gate with sidewall structures. In this case, FIG. 2 depicts of a semiconducting device 200 that has sidewall spacers 216 and 218. Again, semiconducting device 200 is formed on a substrate 202, such as silicon or the like, as described above with respect to FIG. 1. Semiconducting device 200 includes a gate 210 disposed over the substrate and sidewall spacers 216 and 218 disposed on the sidewall of gate 210. Spacers 216 and 218 may comprise and appropriate dielectric material such as an oxide, a nitride, or some combination thereof. Regions 204 and 206 are created in the substrate 202 by implanting dopants using, for example, an ion implantation technique and can form the source or drain of the semiconducting device transistor depending on what potentials are applied to each. Additionally, the device 200 in FIG. 2 may include lightly doped source and drain regions 212 and 214 disposed between the source and drain regions 204 and 204 and the gate 210.

Similarly to the device 100 depicted in FIG. 1, device 200 depicted in FIG. 2 has sidewall structures 216 and 218 that have uneven geometry. Namely, they are narrower at the top then at their base. In this instance, the uneven geometry of the sidewall structures can cause gate-to-gate leakage at the narrow points of the spacers.

Figure 3:
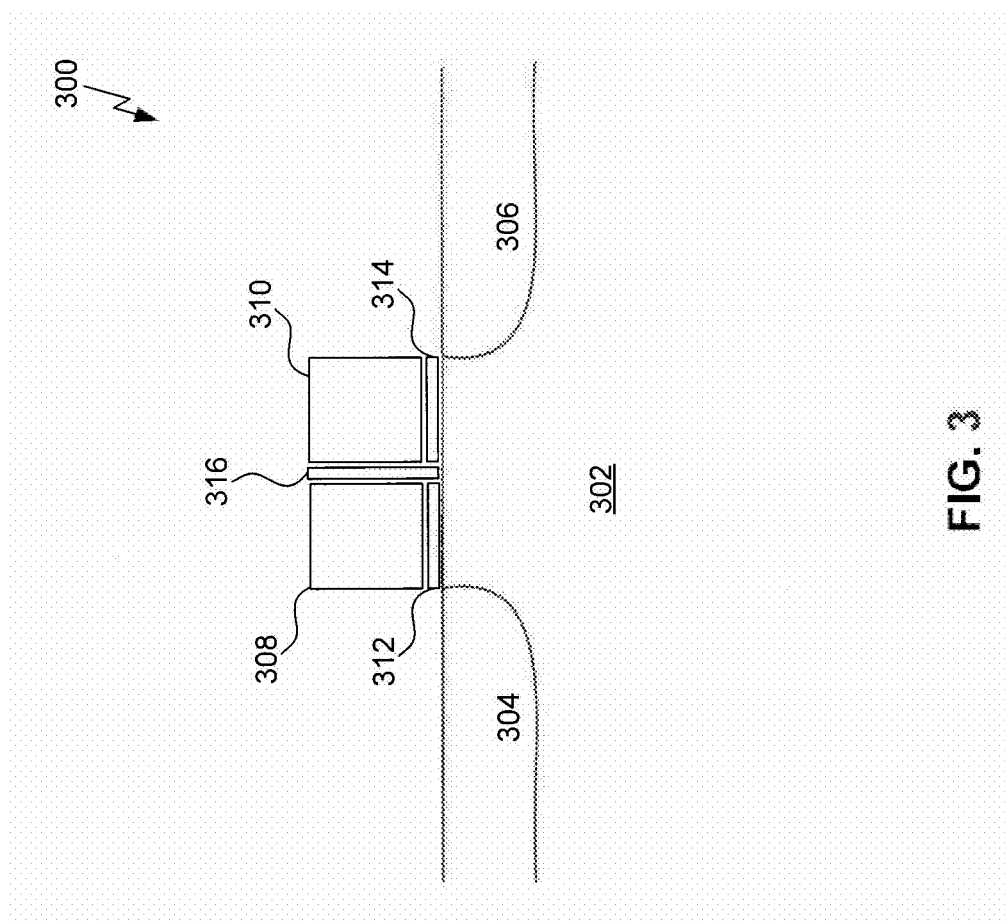
FIG. 3 depicts a cross-section of a split-gate memory cell with an improved select gate structure geometry according to various embodiments.

FIG. 3 illustrates an example of a split-gate memory cell 300 that has an improved geometry in its select gate when compared to the memory cell 100 depicted in FIG. 1, As shown in FIG. 3, split gate memory cell 300 includes features that are analogous to the components of memory cell 100 with a modified select gate 308. That is, it also includes a substrate 302, source/drain regions 304 and 305, a memory gate 310, a select gate 308, sidewall dielectric 316, dielectric 312, and dielectric 314. All of these components can be made of materials as described above with respect to FIG. 1 according to various embodiments. As shown in FIG. 3, the improved select gate 308 is more uniform than the select gate 108 depicted in FIG. 1. Namely, it is substantially the same width at the top as at its base. As such select gate 308 does not suffer from the same issues described above with respect to select gate 108.

Figure 4:
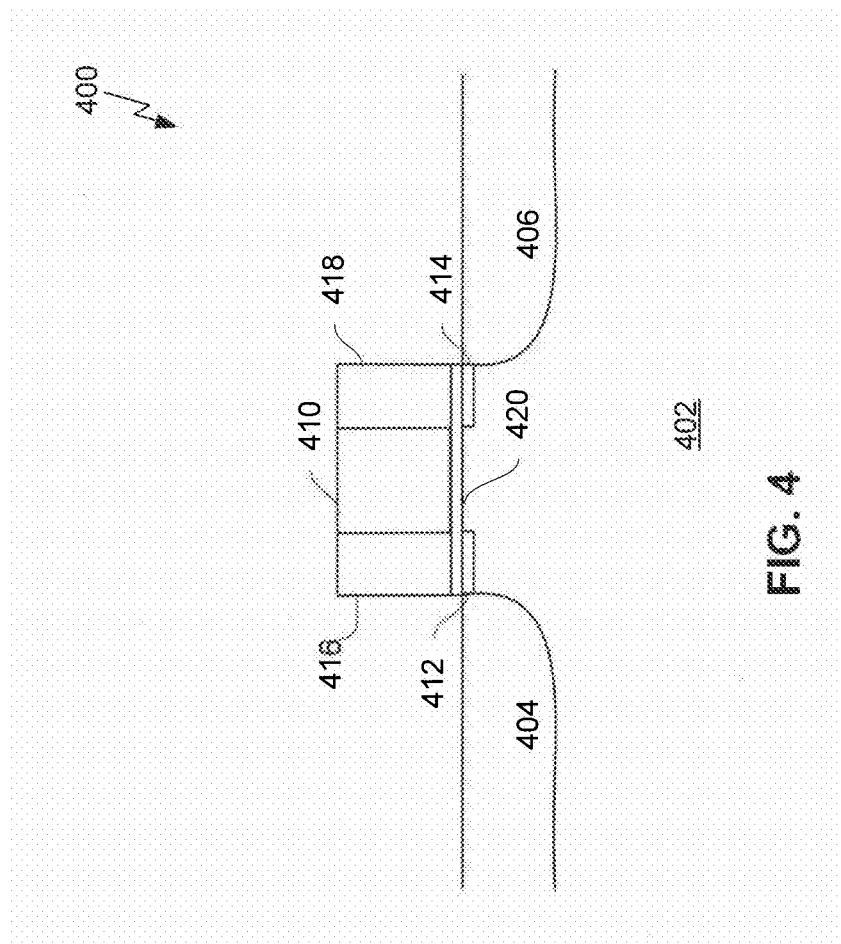
FIG. 4 is a gate with an improved sidewall spacer structure geometry according to various embodiments.

FIG. 4 depicts an improved device 400 having sidewall structures 416 and 418 according to various embodiments. Semiconducting device 400 includes analogous features to those described with respect semiconducting device 200 depicted in FIG. 2, above. For instance, like device 200, device 400 includes a substrate 402, source/drain regions 404 and 406, a gate 410, lightly doped source/drain regions 412 and 414, sidewall structures 416 and 418, and dielectric 420. All of these components can be made of the same materials described above with respect to FIG. 2 according to various embodiments. As shown in FIG. 4, the sidewall structures 416 and 418 have an improved geometry compared to sidewall structures 216 and 218. Namely, sidewall structures 416 and 418 have substantially the same width at their base as at the top. This improved geometry mitigates the problems described above with respect to, for example, the gate-to-gate leakage.

Figure 5A:
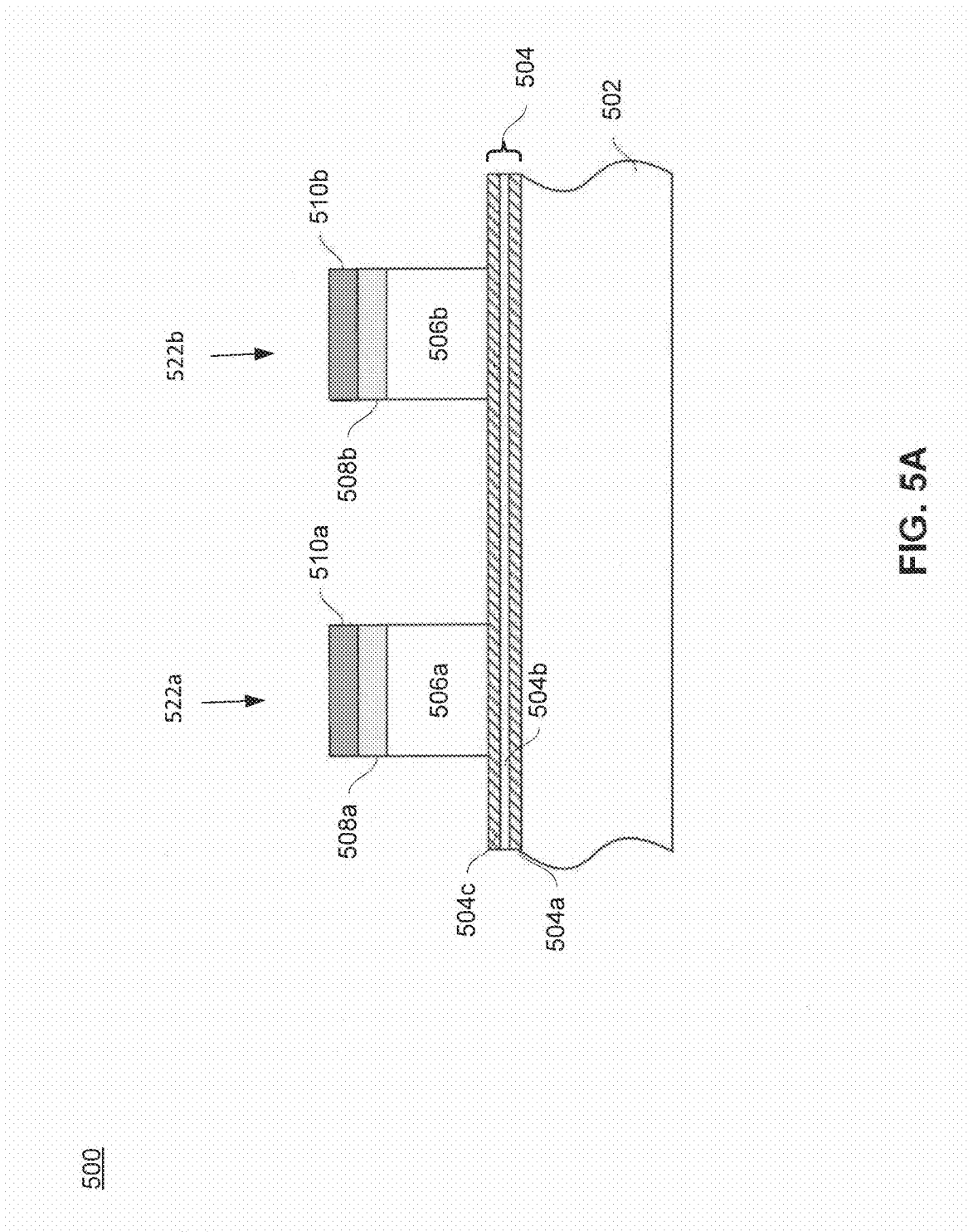

The method for making the improved semiconductor devices 300 and 400 depicted in FIGS. 3 and 4 will now be described with respect to FIGS. 5A-5H, which depict a cross-section of a generic semiconductor device 500 at various stages during its production according to various embodiments. In FIG. 5A, semiconductor device 500 is depicted as having a substrate 502. Gate stacks 522a and 522b have been formed on top of the substrate 502 according to a number of known methods. For instance, U.S. patent application Ser. No. 13/715,577, which is hereby incorporated by reference in its entirety, discloses such a method of creating gate stacks 522a and 522b. The present disclosure is not limited to any particular method of producing gate stacks 522a and 522b. Indeed the spirit and scope of the invention includes any appropriate method for forming gate stacks 522a and 522b.

As can be seen in FIG. 5A, each gate stack 522a and 522b includes a gate conductor 506a and 506b. The gate conductor 506a and 506b may comprise any suitable material such as polycrystalline silicon ("poly"). Gate stacks 522a and 522b may also include mask layers 508a, 508b, 510a, and 510b. As shown in FIG. 5A, each gate stack 522a and 522b has two mask layers. For instance, gate stack 522a has a mask layer 510a and an additional mask layer 508a disposed between the mask layer 510a and the gate conductor layer 506a. It is also possible, according to various embodiments, to omit additional mask layer 508a so that only a single mask layer 510a is associated with the gate stack 522a. Mask layers 508a, 508b, 510a, and 510b may comprise any suitable masking material such as an oxide, nitride, or other dielectric.

A dielectric layer 504 has been disposed above the substrate 502 in the first region and beneath the gate conductor layers 506a and 506b. According to various embodiments, the dielectric comprises one or more layers of dielectric such as ONO, as described above. For instance, if device 500 will be used as a split gate memory cell, the dielectric layer 504 may comprise a first dielectric layer 504a, a charge trapping layer 504b, and a second dielectric layer 504c. Regardless of the specific composition of the dielectric 504, it preferably contains at least one charge trapping layer 504b. The charge trapping layer may be formed of a nitride or silicon rich nitride, and may include multiple layers of different nitrides according to some embodiments. Alternatively, the dielectric layer may comprise a single layer of dielectric material such as an oxide, nitride, or some combination thereof.

Figure 5B:
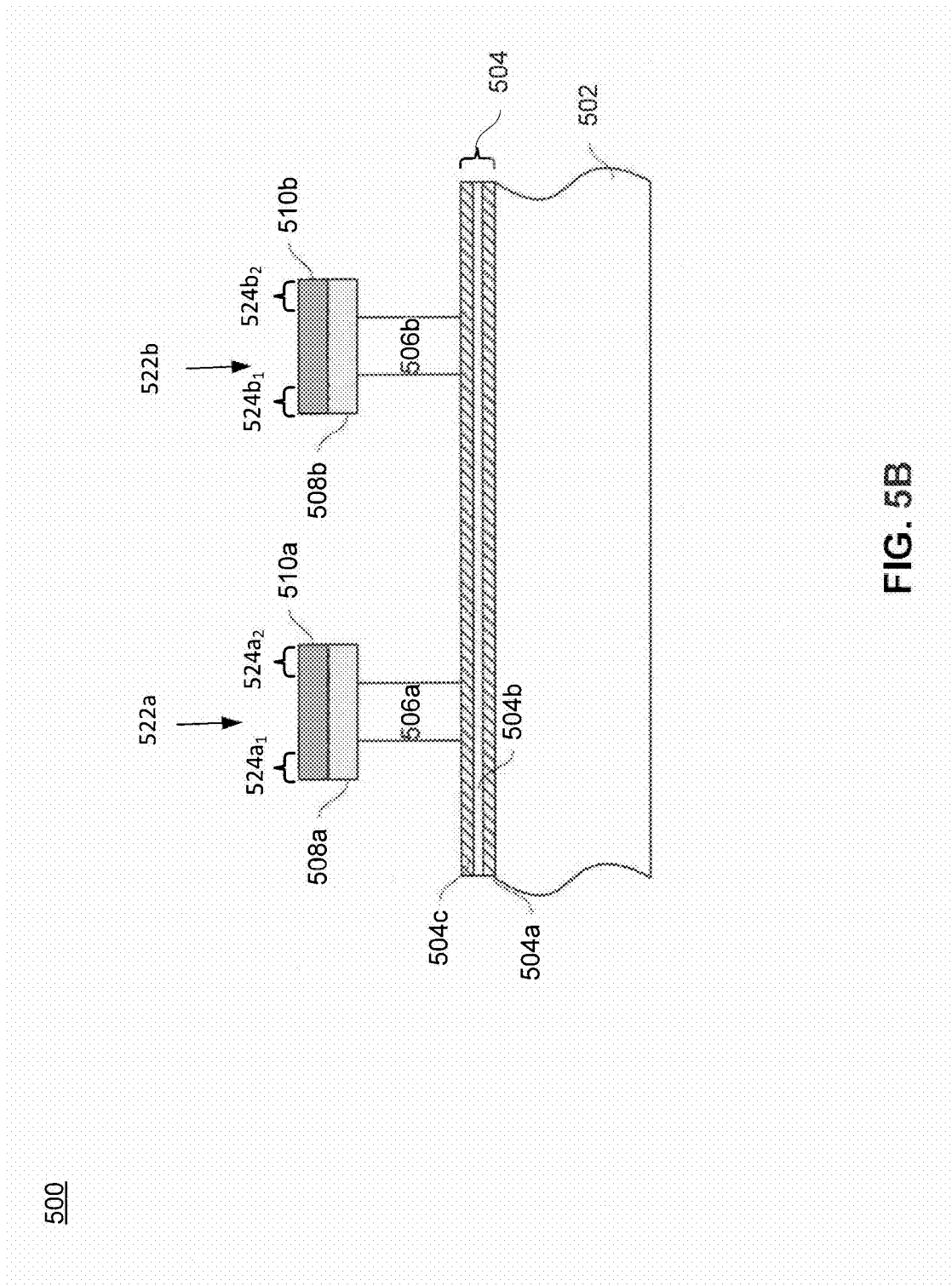

FIG. 5B depicts device 500 after the gate conductor layers 506a and 506b have been etched according to various embodiments. As can be seen, the gate conductor layers 506a and 506b have been laterally etched so that a portion of mask layers 508a, 508b, 510a, and 510b overhangs the gate conductor layers 506a and 506b. For instance, gate conductor layer 506a has been laterally etched so that both mask layers 508a and 510a overhang the gate conductor layer 506a at overhang regions $524a_1$ and $524a_2$. It should be noted, that according to some embodiments, it is possible to only laterally etch one of the sidewalls of gate conductor layers 506a and 506b at this point. For instance, the gate conductor layers 506a and 506b could be etched such that overhang regions $524a_1$ and $524b_1$ are created but not overhang portions $524a_2$ and $524b_2$. That is, the sides of the gate conductor layers 506a and 506b opposite the overhang regions $524a_1$ and $524b_1$ could remain flush with mask layers 508a, 508b, 310a, and 510b.

According to some embodiments, the conductor layers 506a and 506b can be etched using any of a number of appropriate etching methods. According to some embodiments wet or dry isotropic poly etch can be used. Additionally, the gate conductor layers 506a and 506b may be etched using Cl2, KOH, TMAH (tetra-methyl-amino-hydroxyl), or using gas phase etching with, for instance, H2, HCl, O2, H2O (vapor or gas), O3, HF, F2, and Carbon-Fluoride compounds with Cl2 and XeF2. Additionally, according to some embodiments, a combination of etching products may be used.

Figure 5C:
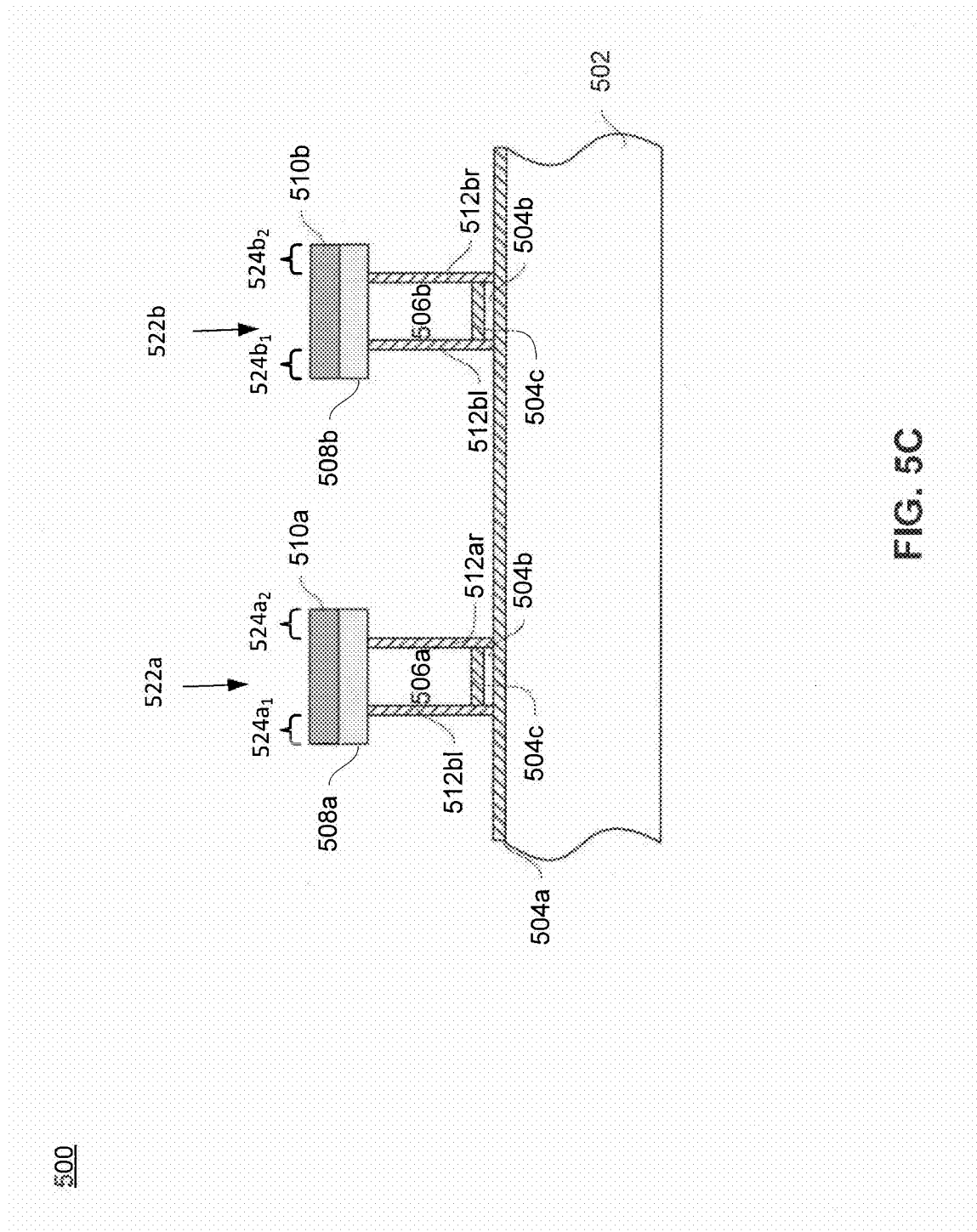

FIG. 5C depicts device 500 at a further point in the production process. As can be seen, the dielectric 504 has been etched at various points. For instance, layers 504c and 504b have been removed from the portions of the dielectric 504 beneath the overhang regions $524a_1$, $524a_2$, $524b_1$, and $524b_2$. Additionally, layers 504c and 504b have been removed from the dielectric 504 in the area between the gate stacks 522a and 522b. Indeed, as shown in FIG. 5C, layers 504c and 504b have been removed from any portion of the dielectric 504 not covered by one of the gate stacks 522a and 522b, but layers 504c and 504b may be removed more selectively from dielectric 504. For instance, according to various embodiments, only the portions of layers 504c and 504b disposed beneath the overhang regions $524a_1$, $524a_2$, $524b_1$, and $524b_2$ can be removed.

FIG. 5C also depicts left and right sidewall dielectric 512al, 512ar, 512bl, and 512br (collectively sidewall dielectric 512) formed on the etched portions of gated conductor layers 506a and 506b. Sidewall dielectric 512 may comprise a single layer dielectric or a multiple layer dielectric such as ONO, described above. It should be noted that formation of the sidewall dielectric 512 is optional. Indeed, in instances where the device 500 will is not a split-gate memory cell this step can be omitted entirely.

Figure 5D:
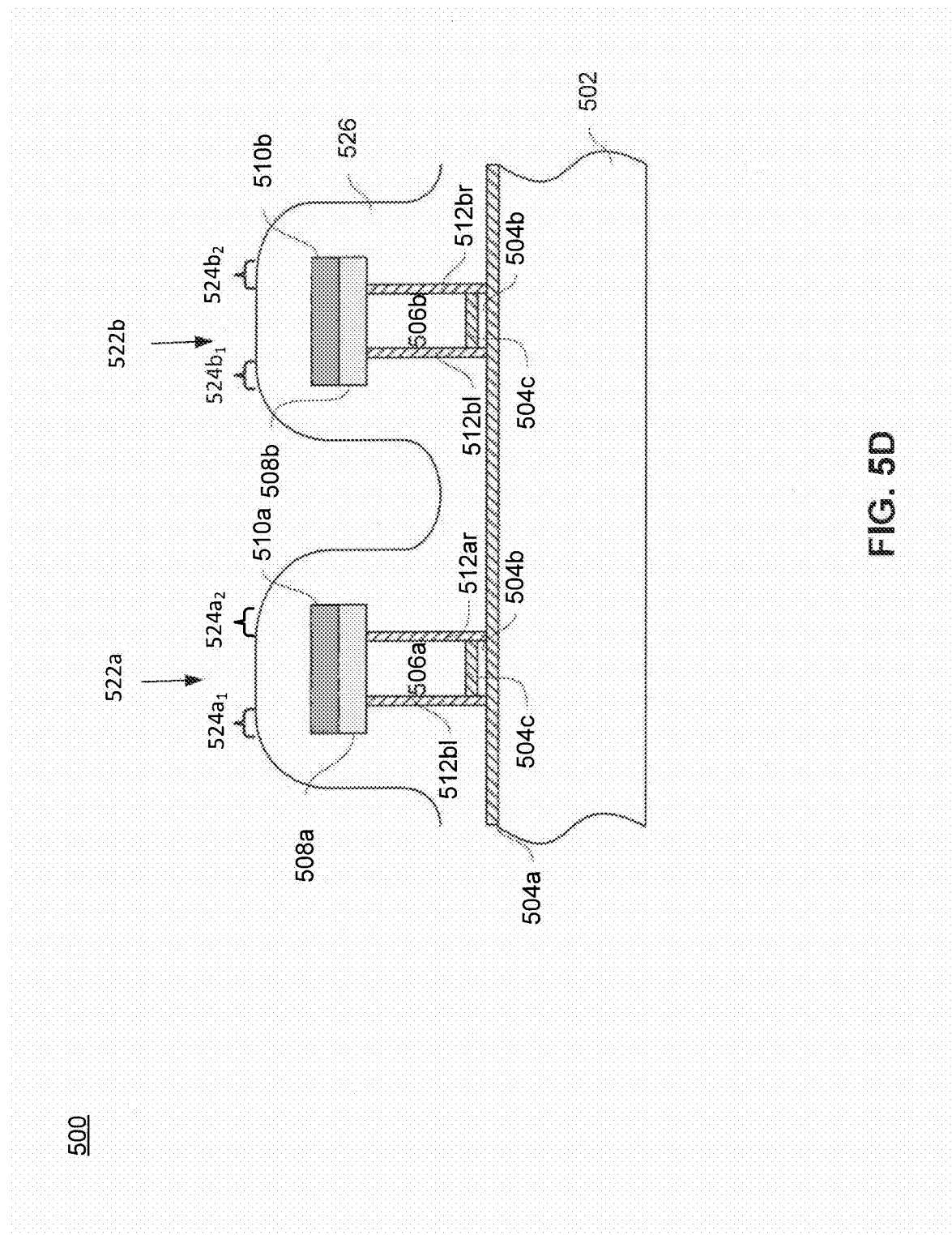

FIG. 5D depicts device 500 after a sidewall structure layer 526 has been formed. According to various embodiments, the sidewall structure layer 526 can be substantially conformal with the structures (e.g., gate stacks 522a and 522b) formed on substrate 502. The sidewall structure layer 526 may comprise any suitable material depending on the device being formed. For instance, if device 500 will be a select gate, then the sidewall structure layer 526 may comprise any suitable material for acting as, for instance, a select gate. According to various embodiments, polycrystalline silicon can be used to form the sidewall structure layer 526. However, this need not be the case according to all embodiments. Indeed, in embodiments where device 500 will be used as a split-gate memory cell, the sidewall structure layer 526 may comprise any suitable dielectric or other material.

As can be seen in FIG. 5D, a portion the sidewall structure layer 526 has been deposited beneath overhang regions $524a_1$, $524a_2$, $524b_1$, and $524b_2$.

FIG. 5E depicts device 500 after portions of the sidewall structure layer 526 have been removed by, e.g., etching. However, as shown in FIG. 5E, the portions 534a, 534b, 536a, and 536b of the sidewall structure layer 526 that were formed substantially beneath the overhang regions $524a_1$, $524a_2$, $524b_1$, and $524b_2$ have not been removed and remain disposed on the sidewalls of first gate conductor layer 506a and 506b.

Figure 5F:
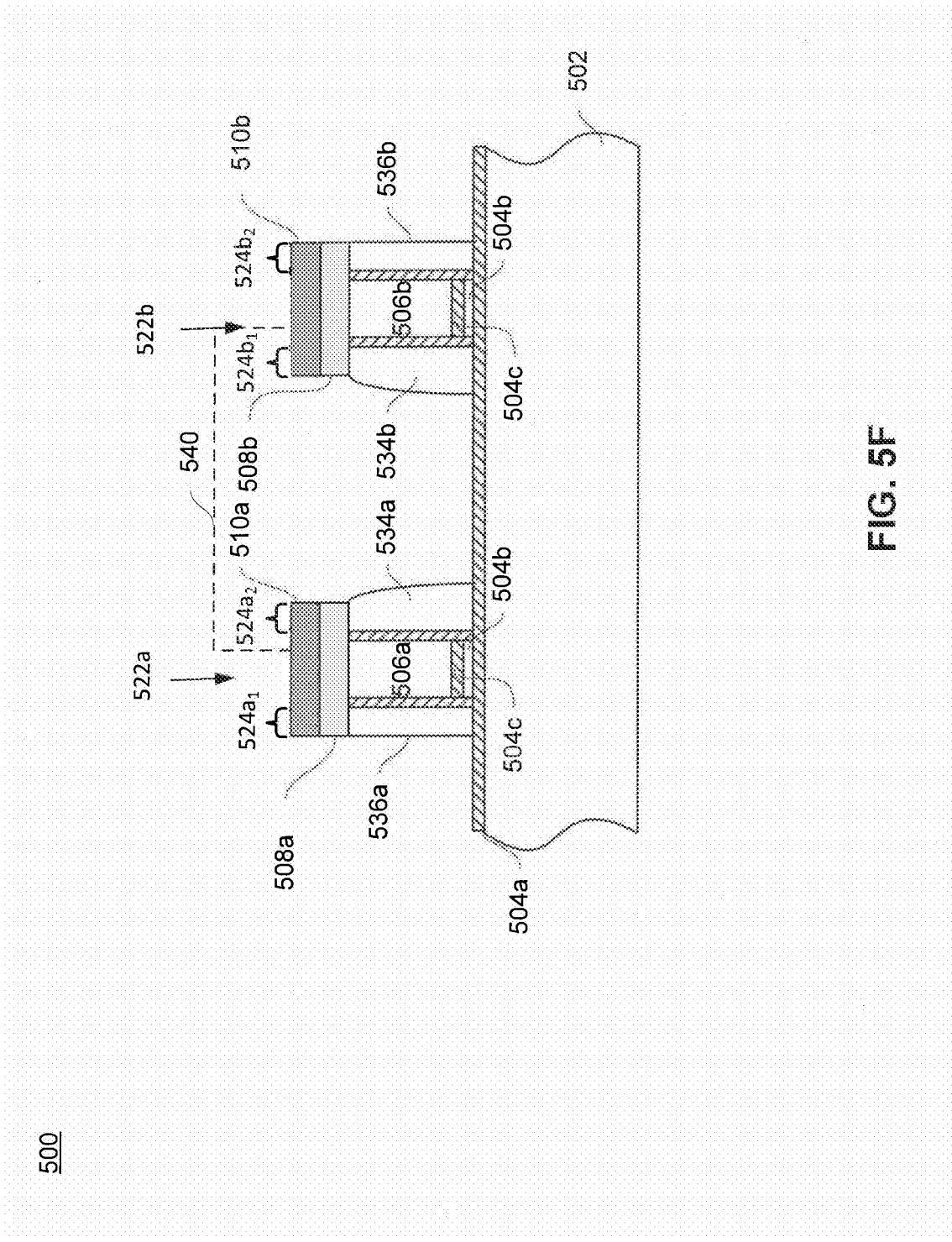

According to various embodiments, remaining portions 536a and 536b of the sidewall structure layer 526 may be superfluous to device 500 and can be removed, as shown in FIG. 5F. In FIG. 5F, a mask 540 has been formed over the portion of device 500 that contains remaining portions 534a and 534b. Mask 540 may comprise any suitable material that allows for selective removal (e.g., etching) of the unmasked portion of the remaining sidewall structure layer 526 (i.e., remaining portions 536a and 536b). According to some embodiments, mask 540 may comprise a photoresist such as Poly(methyl methacrylate) (PMMA), Poly(methyl glutarimide) (PMGI), a Phenol formaldehyde resin, a suitable epoxy, etc.

Figure 5G:
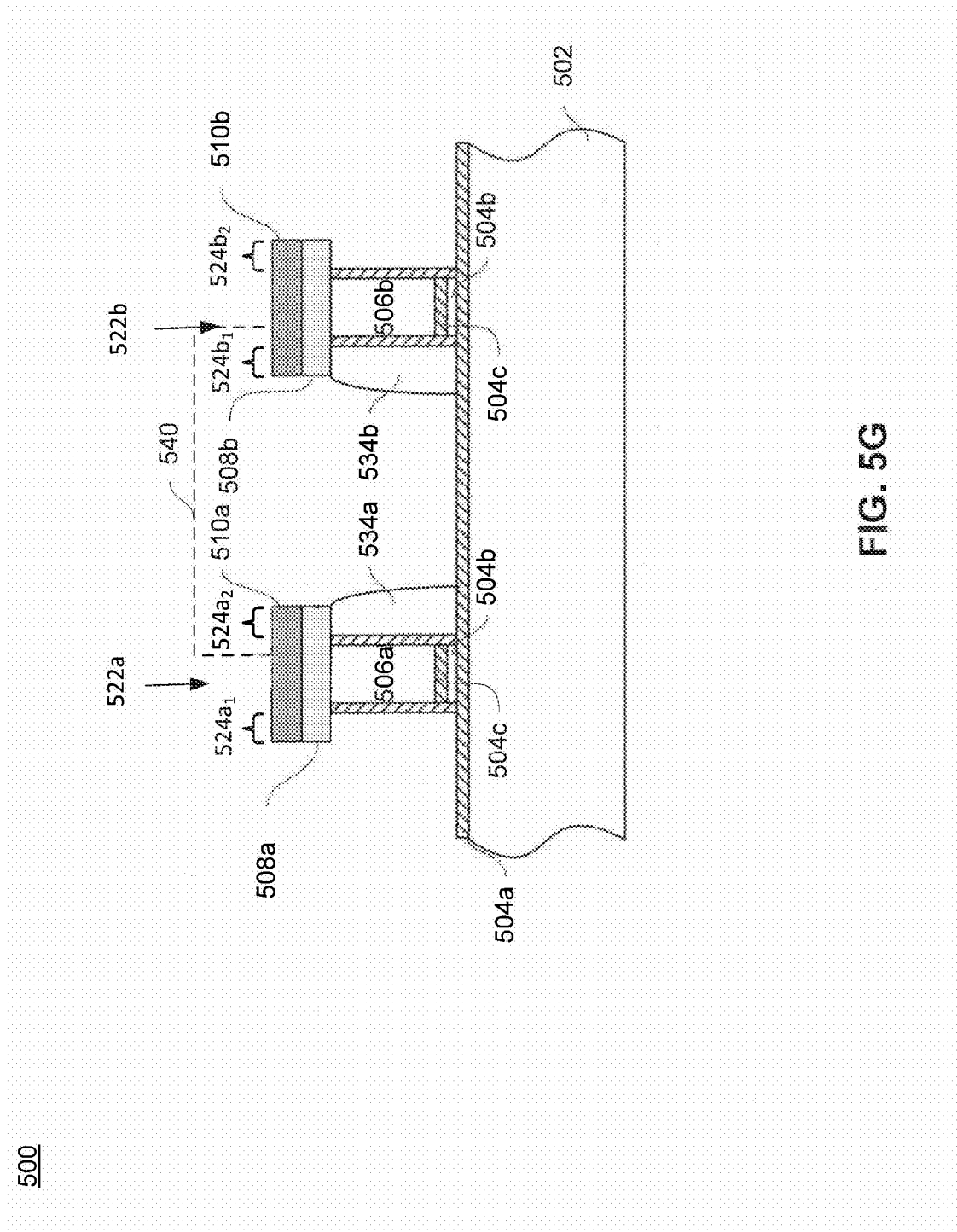

As shown in FIG. 5F, some method of removing the remaining portions 536a and 536b may leave some of the material disposed beneath the overhang regions $524a_1$, $524a_2$, $524b_1$, and $524b_2$, This can be removed using any of a number of well-known methods as shown in FIG. 5G. While sidewall dielectrics 512al and 512br are shown still present in FIG. 5G, it may be advisable to remove them according to various embodiments. However, according to other embodiments, it might be advisable to allow sidewall dielectrics 512al and 512br to remain.

Figure 5H:
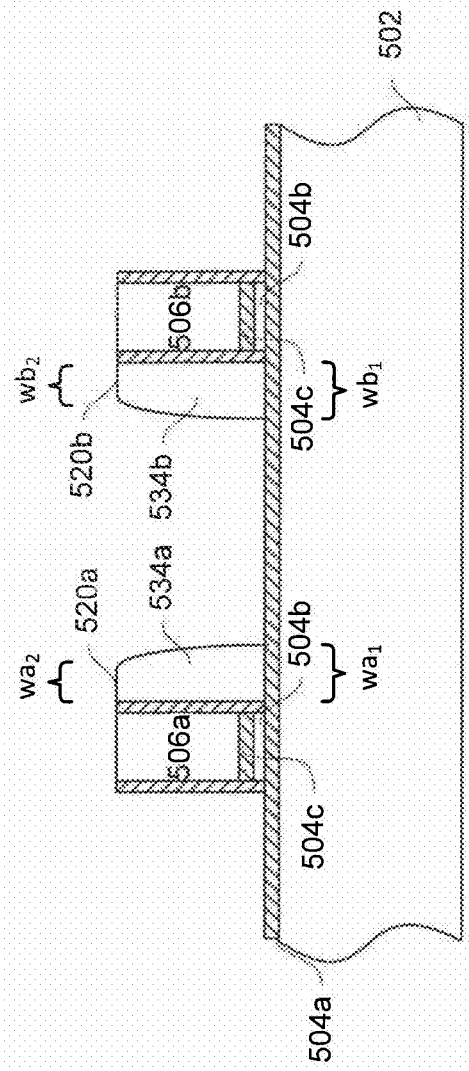

FIG. 5H depicts device 500 after mask layers 508a, 508b, 510a, and 510b have been removed from the top of the gate stacks 522a and 522b and from the top of structures 534a and 534b, which were previously disposed beneath overhang portions $524a_1$ and $524b_1$. As can be seen, where mask layers 508a and 508b previously contacted structures 534a and 534b, substantially flat portions 520a and 520b remain. These substantially flat portions 520a and 520b allow for better contact formation when structures 534a and 534b are used to make select gates. Additionally, according to various embodiments, first gate conductor layers 506a and 506b can be used to make memory gates.

As shown in FIG. 5H, the structures 534a and 534b each have a width associated with their base ($wa_1$ and $wb_1$, respectively). Similarly, the substantially flat portions 520a and 520b have widths associated with them ($wa_2$ and $wb_2$, respectively). According to various embodiments, the widths $wa_2$ and $wb_2$ of the substantially flat portions 520a and 520b may be greater than or equal to half the widths $wa_1$ and $wb_1$ of the bases of structures 534a and 534b. Additionally, as can be seen, the substantially flat top portions 520a and 520b may be substantially co-planer with the tops of first gate conductor layers 506a and 506b.

Figure 6:
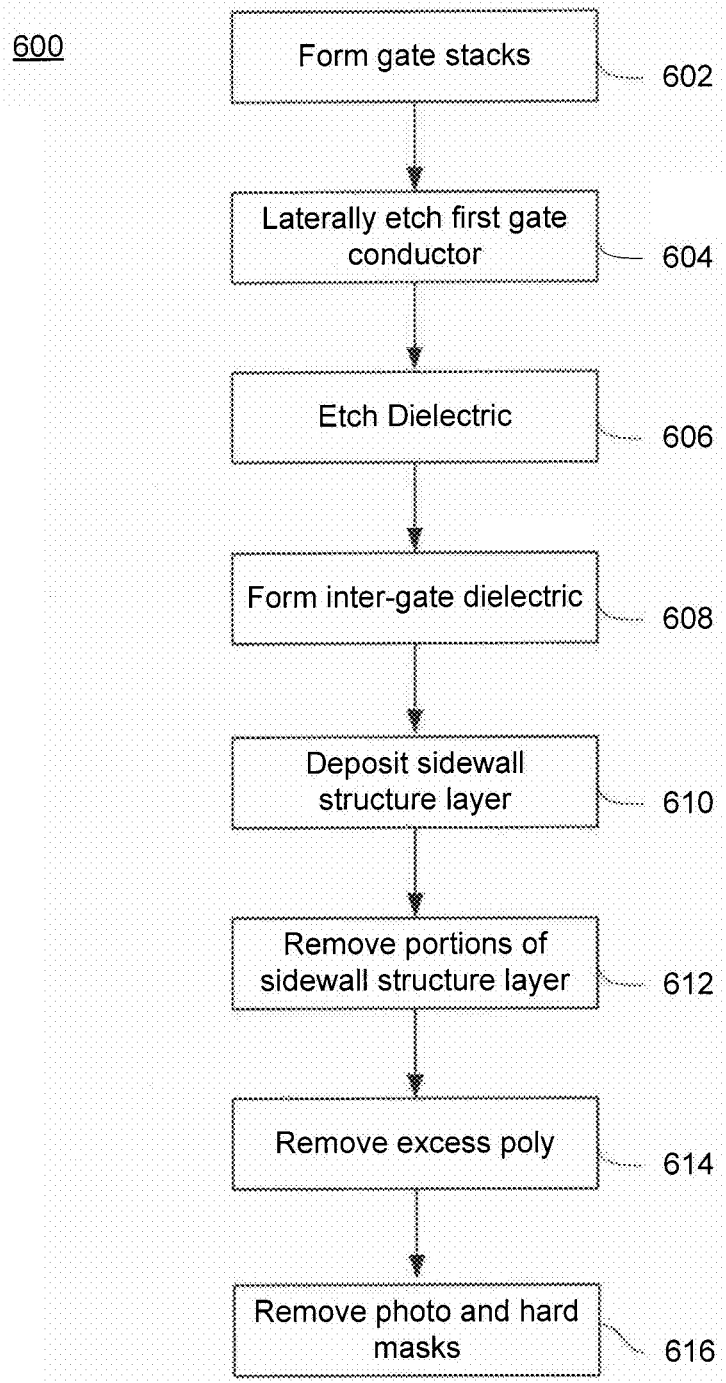
FIG. 6 is a flowchart depicting a method of manufacturing a semiconducting device according to various embodiments.

FIG. 6 depicts a method 600 of constructing a semiconductor device such as device 500 according to various embodiments. The discussion of FIG. 6 will make reference to FIGS. 5A-5H, but it should be understood that method 600 is not limited to the specific embodiments depicted in FIGS. 5A-5H, but is more generally applicable.

As shown in FIG. 6, method 600 begins at step 602 by forming gate stacks (e.g., gate stacks 522a and 522b) on a substrate 502. Each gate stack 522a and 522b may includes a gate conductor 506a and 506b. Gate stacks 522a and 522b may also include mask layers 508a, 508b, 510a, and 510b.

According to some embodiments, each gate stack may have multiple mask layers. For instance, a gate stack 522a might have a mask layer 510a and an additional mask layer 508a disposed between the mask layer 510a and the gate conductor layer 506a. It is also possible, according to various embodiments, to omit additional mask layer 508a so that only a single mask layer 510a is associated with the gate stack 522a. Mask layers 508a, 508b, 510a, and 510b may comprise any suitable masking material such as an oxide, nitride, or other dielectric.

At step 604, gate conductor layers 506a and 506b can be laterally etched. The gate conductor layers 506a and 506b can be laterally etched so that a portion of mask layers 508a, 508b, 510a, and 510b overhangs the gate conductor layers 506a and 506b. For instance, gate conductor layer 506a has been laterally etched so that both mask layers 508a and 510a overhang the gate conductor layer 506a at overhang regions $524a_1$ and $524a_2$. It should be noted, that according to some embodiments, it is possible only laterally etch one of the sidewalls of gate conductor layers 506a and 506b at this point. For instance, the gate conductor layers 506a and 506b could be etched such that overhang regions $524a_1$ and $524b_1$ are created but not overhang portions $524a_2$ and $524b_2$. That is, the sides of the gate conductor layers 506a and 506b opposite the overhang regions $524a_1$ and $524b_1$ could remain flush with mask layers 508a, 508b, 510a, and 510b.

At step 606, a dielectric 504 that is disposed on the substrate 502 can be etched or partially etched. For instance, layers 504c and 504b can be removed from the portions of the dielectric 504 beneath the overhang regions $524a_1$, $524a_2$, $524b_1$, and $524b_2$. Additionally, layers 504c and 504b can be removed from the dielectric 504 in the area between the gate stacks 522a and 522b. Indeed, as shown in FIG. 5C, layers 504c and 504b have been removed from any portion of the dielectric 504 not covered by one of the gate stacks 522a and 522b, but layers 504c and 504b may be removed more selectively from dielectric 504. For instance, according to various embodiments, only the portions of layers 504c and 504b disposed beneath the overhang regions $524a_1$, $524a_2$, $524b_1$, and $524b_2$ can be removed.

At step 608, an inter-gate or sidewall dielectric 512al, 512ar, 512bl, and 512br (collectively sidewall dielectric 512) formed on the etched portions of gated conductor layers 506a and 506b according to method 600. Sidewall dielectric 512 may comprise a single layer dielectric or a multiple layer dielectric such as ONO, described above.

At step 610, the method can deposit a sidewall structure layer 526. According to various embodiments, the sidewall structure layer 526 can be formed so that it is substantially conformal with the structures (e.g., gate stacks 522a and 522b) formed on substrate 502. However, this need not be the case according to all embodiments. The sidewall structure layer 526 may comprise any suitable material for acting as, for instance, a select gate. According to various embodiments, polycrystalline silicon can be used to form the sidewall structure layer 526. However, according to other embodiments, the sidewall structure layer 526 may comprise any number of other materials such as a dielectric. As can be seen in FIG. 5D, a portion the sidewall structure layer 526 has been deposited beneath overhang regions $524a_1$, $524a_2$, $524b_1$, and $524b_2$.

At step 612, portions of the sidewall structure 526 can be removed. Some portions 534a, 534b, 536a, and 536b of the sidewall structure layer 526 that were formed substantially beneath the overhang regions $524a_1$, $524a_2$, $524b_1$, and $524b_2$ can be left and remain disposed on the sidewalls of first gate conductor layer 506a and 506b.

At step 614, any remaining excess portions of the sidewall structure layer (particularly portions 536a and 536b) can be removed using a number of well-known methods. It is also possible to remove sidewall dielectrics 512al and 512br, but this is not necessary in all embodiments.

At step 616, after mask layers 508a, 508b, 510a, and 510b are removed from the top of the gate stacks 522a and 522b and from the top of structures 534a and 534b, which were previously disposed beneath overhang portions 524a$_1$ and 524b$_1$. As can be seen, where mask layers 508a and 508b previously contacted structures 534a and 534b, substantially flat portions 520a and 520b remain. These substantially flat portions 520a and 520b allow for better contact formation when structures 534a and 534b are used to make select gates. Additionally, according to various embodiments, first gate conductor layers 506a and 506b can be used to make memory gates.

FIGS. 7A-7H depict a cross section of device 700 at various points during its manufacture. As will be seen, while device 700 is the same as device 500 in a number of ways, it differs in several other ways.

Figure 7A:
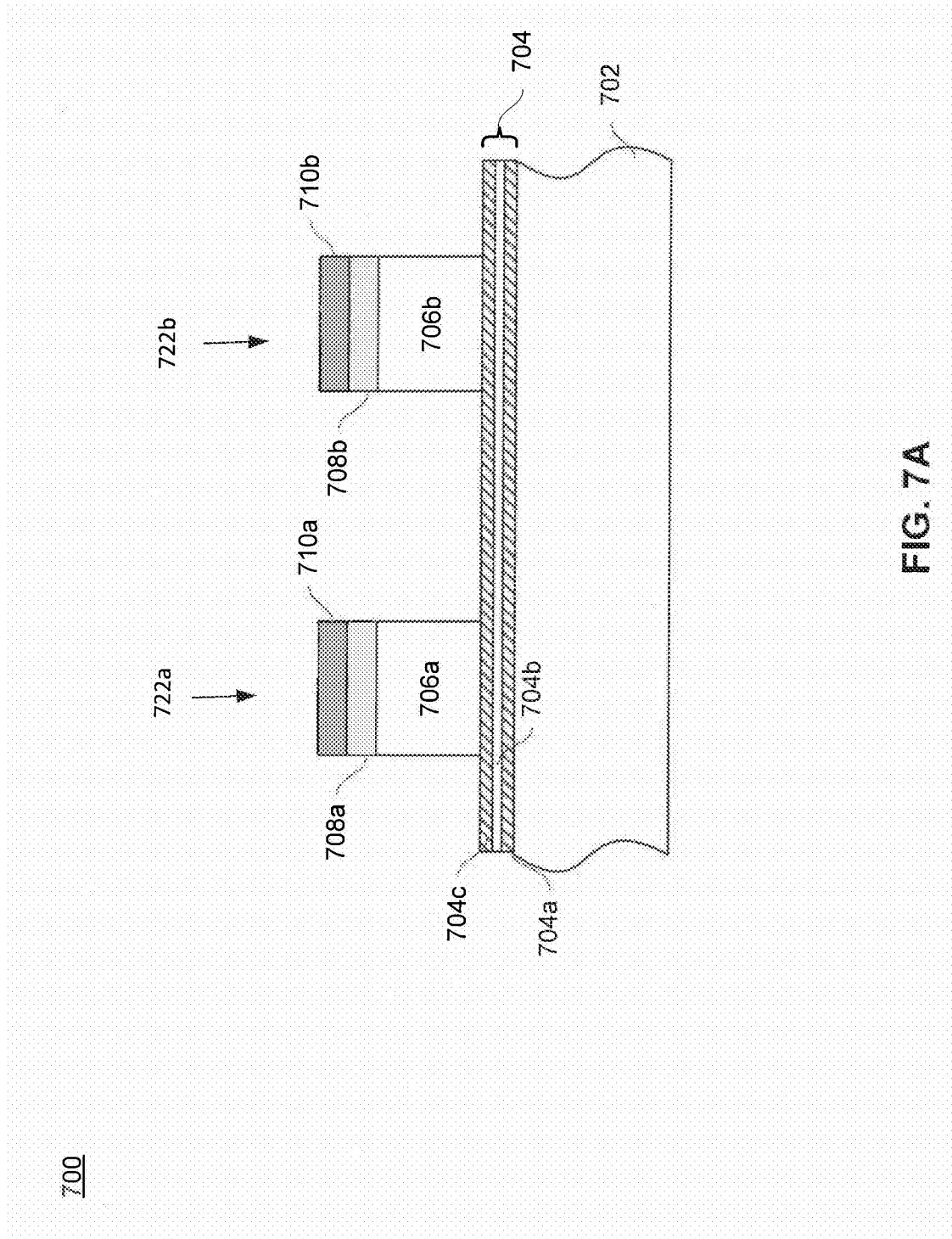

As can be seen in FIG. 7A, device 700—much like device 500—includes gate stacks 722a and 722b have been formed on top of the substrate 702 according to a number of known methods. Each gate stack 722a and 722b includes a gate conductor 706a and 706b. The gate conductor 706a and 706b may comprise any suitable material such as polycrystalline silicon ("poly"). Gate stacks 722a and 722b may also include mask layers 708a, 708b, 710a, and 710b. Each gate stack 722a and 722b has two mask layers: a mask layer 710a and an additional mask layer 708a disposed between the mask layer 710a and the gate conductor layer 706a. Mask layers 708a, 708b, 710a, and 710b may comprise any suitable masking material such as an oxide, nitride, or other dielectric. A dielectric 704, which may be similar to dielectric 504, has been disposed above the substrate 702 in the first region and beneath the gate conductor layers 706a and 706b.

Figure 7B:
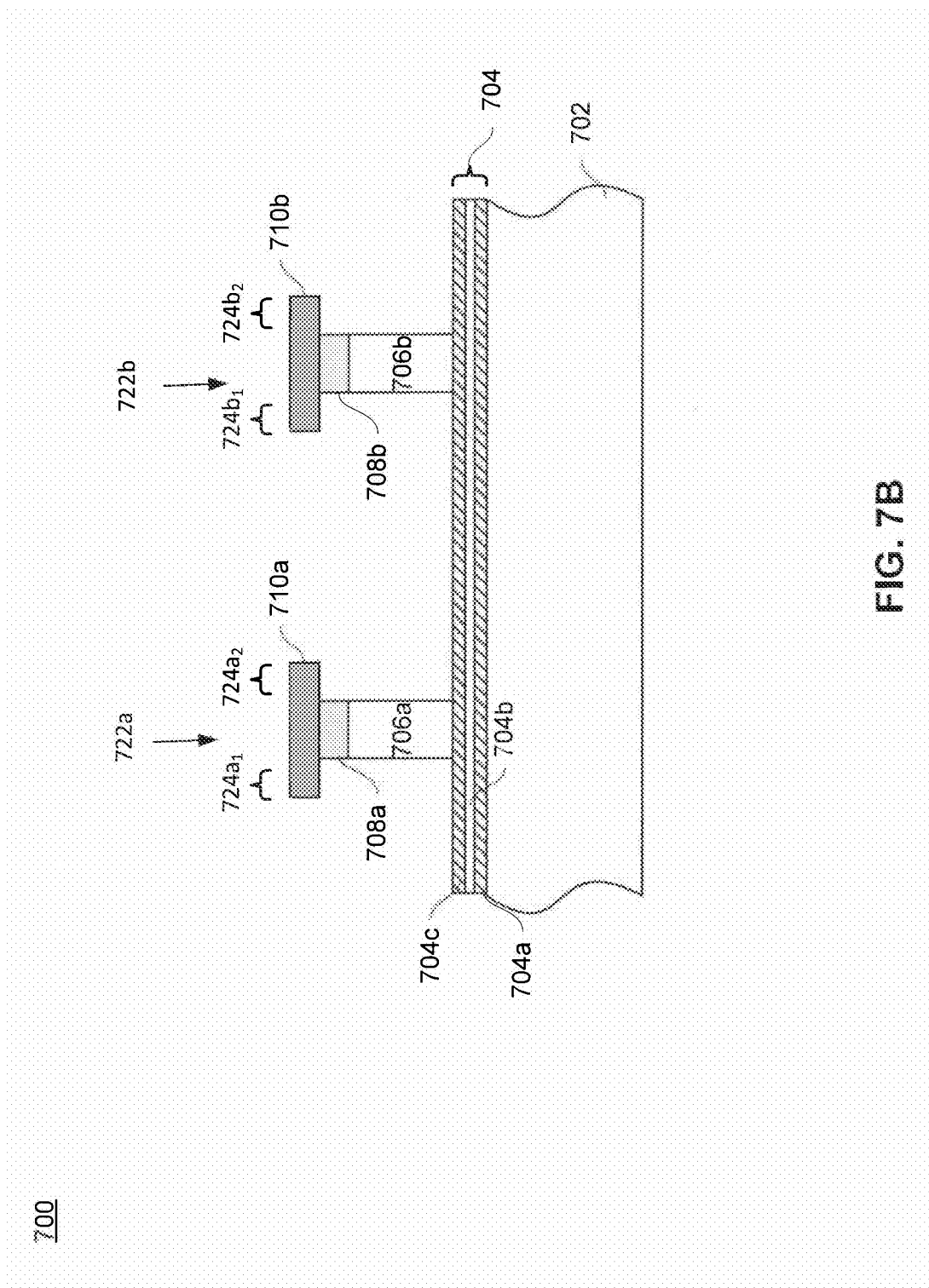

FIG. 7B depicts device 700 after the gate conductor layers 706a and 706b have been etched according to various embodiments. As can be seen, the gate conductor layers 706a and 706b have been laterally etched so that a portion of mask layers 710a and 710b overhangs the gate conductor layers 706a and 706b. Additionally, and different from device 500, mask layers 708a and 708b have also been etched so that a portion of mask layers 710a and 710b overhangs mask layers 708a and 708b as well. For instance, gate conductor layer 706a and mask layer 708a have both been laterally etched so that mask layer 710a overhangs the gate conductor layer 706a and mask layer 708a at overhang regions 724a$_1$ and 724a$_2$. It should be noted, that according to some embodiments, it is possible only laterally etch one of the sidewalls of gate conductor layers 706a and 706b and/or mask layers 708a and 708b at this point. For instance, the gate conductor layers 706a and 706b and/or the mask layers 708a and 708b could be etched such that overhang regions 724a$_1$ and 724b$_1$ are created but not overhang portions 724a$_2$ and 724b$_2$. That is, the sides of the gate conductor layers 706a and 706b and/or 708a and 708b opposite the overhang regions 724a$_1$ and 724b$_1$ could remain flush with mask layers 710a and 710b.

Figure 7C:
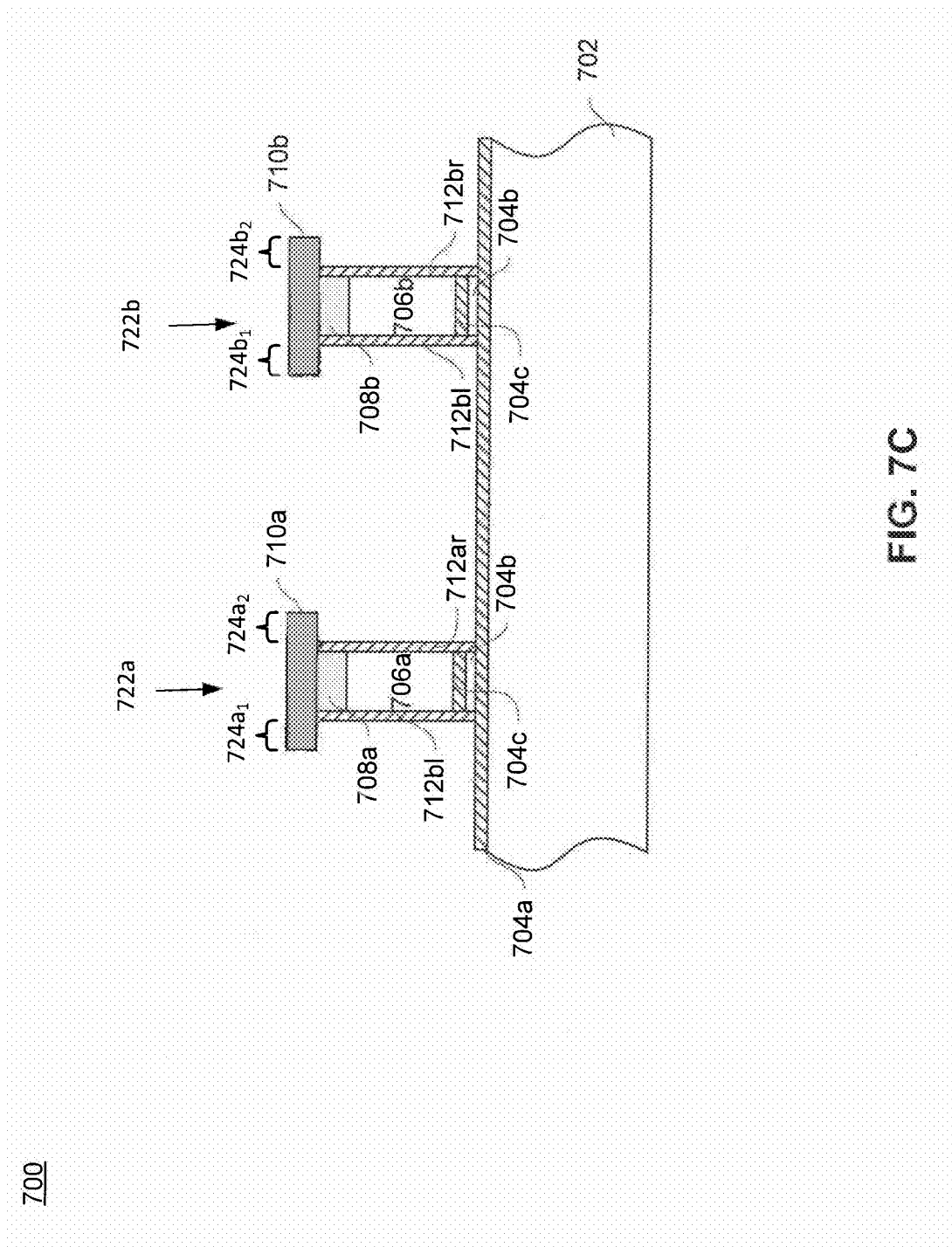

FIG. 7C depicts device 700 at a further point in the production process. As can be seen, the dielectric 704 has been etched at various points. For instance, layers 704c and 704b have been removed from the portions of the dielectric 704 beneath the overhang regions 724a$_1$, 724a$_2$, 724b$_1$, and 724b$_2$. Additionally, layers 704c and 704b have been removed from the dielectric 704 in the area between the gate stacks 722a and 722b. Indeed, as shown in FIG. 7C, layers 704c and 704b have been removed from any portion of the dielectric 704 not covered by one of the gate stacks 722a and 722b, but layers 704c and 704b may be removed more selectively from dielectric 704. For instance, according to various embodiments, only the portions of layers 704c and 704b disposed beneath the overhang regions 724a$_1$, 724a$_2$, 724b$_1$, and 724b$_2$ can be removed.

Figure 7D:
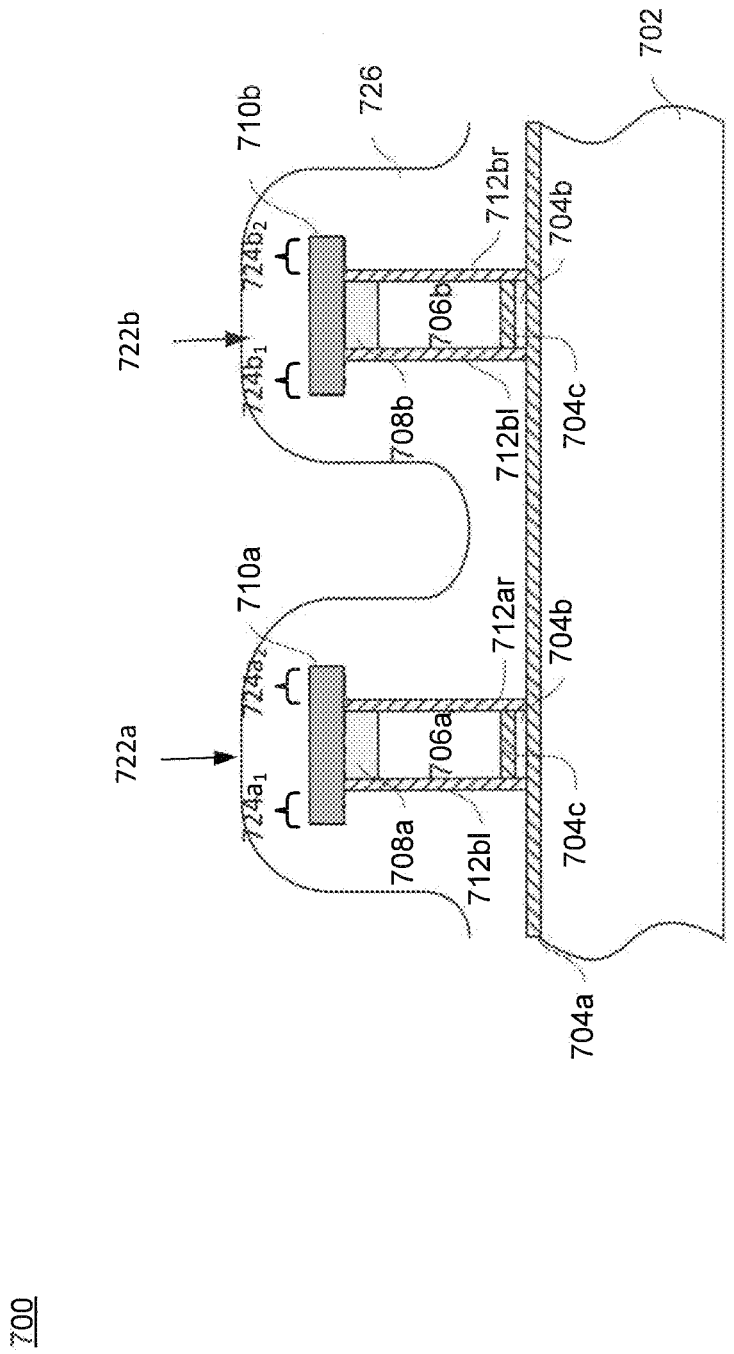

FIG. 7C also depicts sidewall dielectric 712al, 712ar, 712bl, and 712br (collectively sidewall dielectric 712) formed on the etched portions of gated conductor layers 706a and 706b and additional mask layers 708a and 708b. As with the formation of sidewall dielectric 512, the formation of sidewall dielectric 712 is entirely optional depending on the use of device 700. FIG. 7D depicts device 700 after a sidewall structure layer 726 has been formed. According to various embodiments, the sidewall structure layer 726 can be substantially conformal with the structures (e.g., gate stacks 722a and 722b) formed on substrate 702. The sidewall structure layer 726 may comprise similar materials described above with respect to sidewall structure layer 526. As can be seen in FIG. 7D, a portion the sidewall structure layer 726 has been deposited beneath overhang regions 724a$_1$, 724a$_2$, 724b$_1$, and 724b$_2$.

Figure 7E:
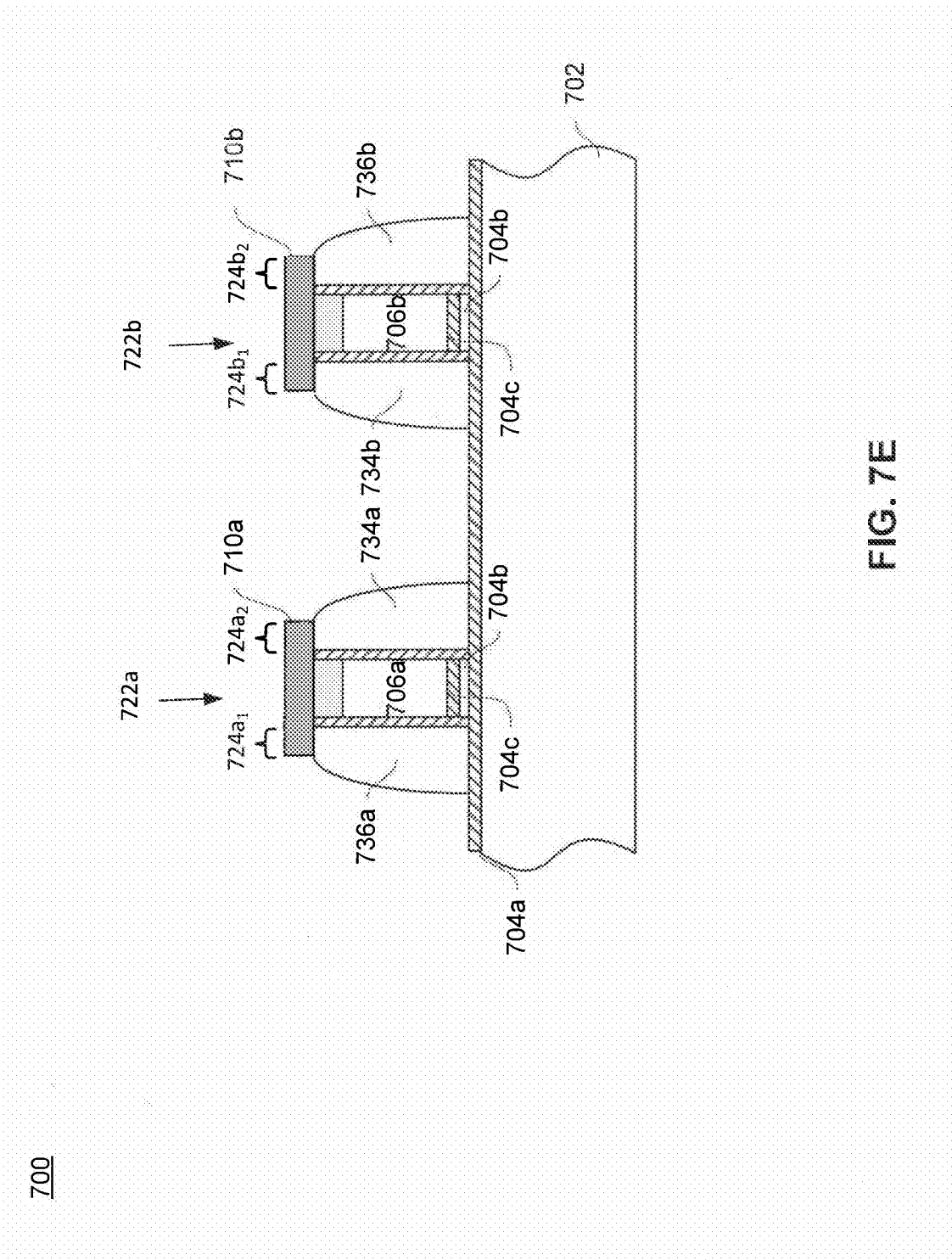

FIG. 7E depicts device 700 after portions of the sidewall structure layer 726 have been removed by, e.g., etching. However, as shown in FIG. 7E, the portions 734a, 734b, 736a, and 736b of the sidewall structure layer 726 that were formed substantially beneath the overhang regions 724a$_1$, 724a$_2$, 724b$_1$, and 724b$_2$ have not been removed and remain disposed on the sidewalls of first gate conductor layer 706a and 706b and the additional mask layer 708a and 708h.

Figure 7F:
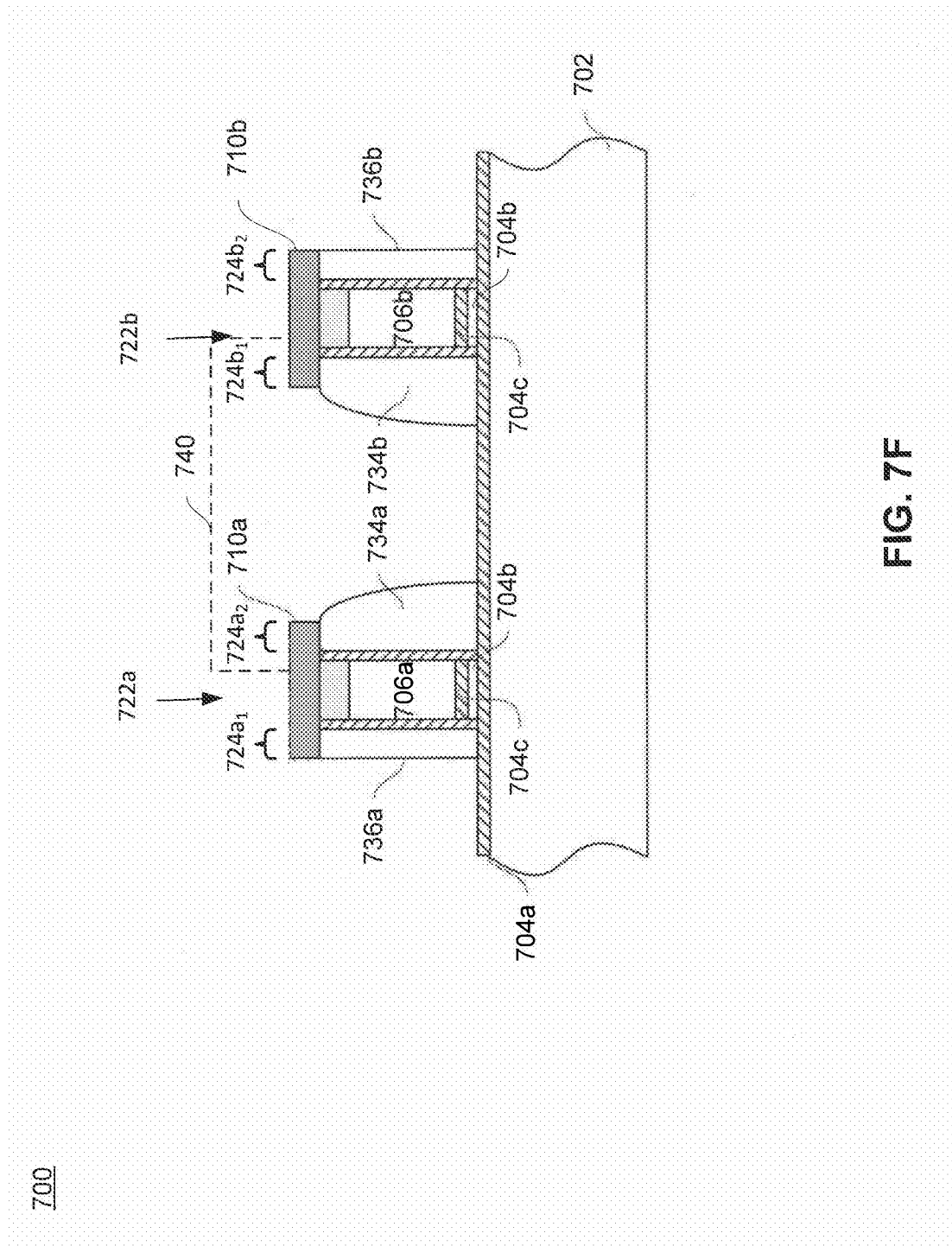

According to various embodiments, remaining portions 736a and 736b of the sidewall structure layer 726 may be superfluous to device 700 and can be removed, as shown in FIG. 7F. In FIG. 7F, a mask 740 has been formed over the portion of device 700 that contains remaining portions 734a and 734b.

Figure 7G:
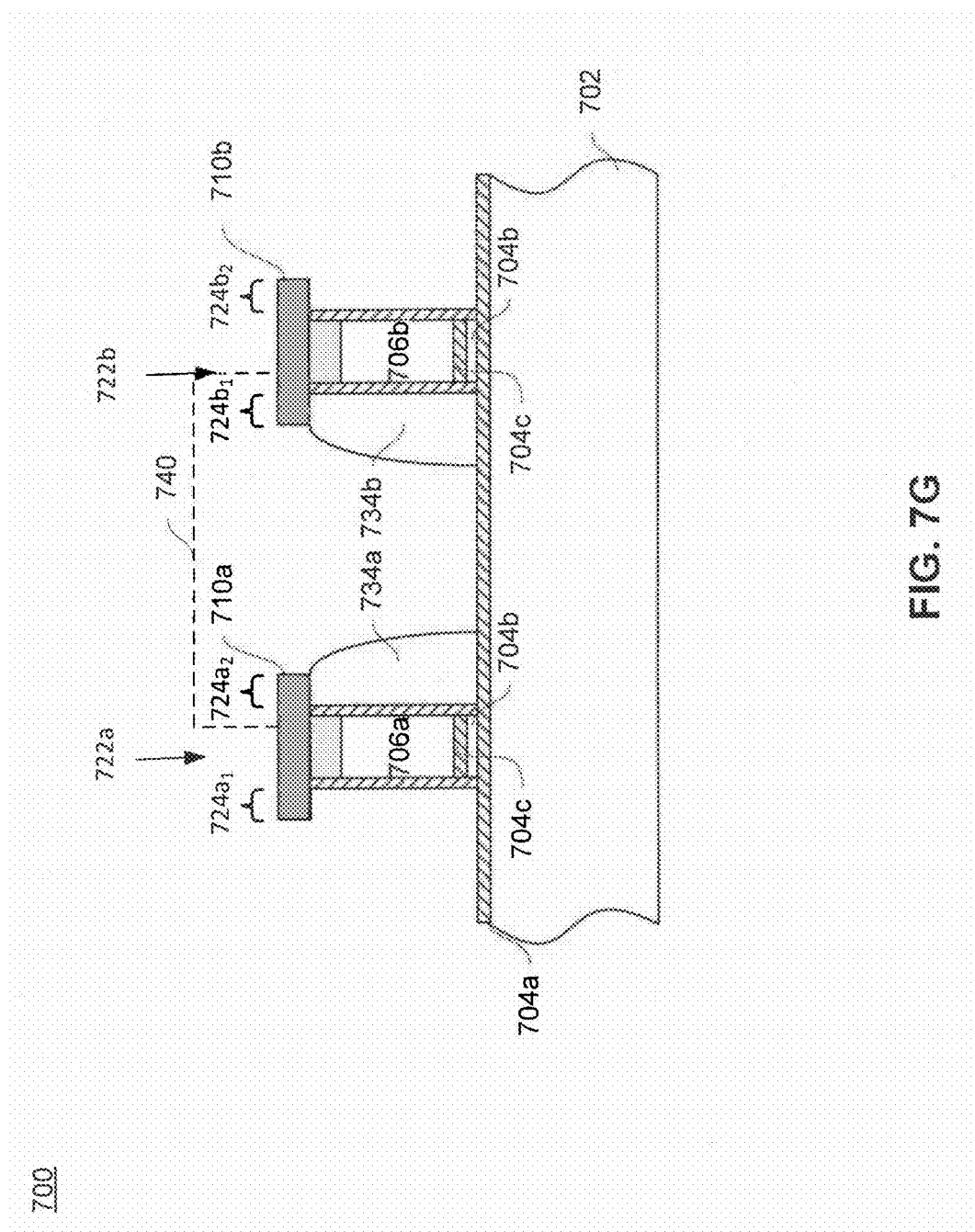

As shown in FIG. 7F, some method of removing the remaining portions 736a and 736b may leave some of the material disposed beneath the overhang regions 724a$_1$, 724a$_2$, 724b$_1$, and 724b$_2$. This can be removed using any of a number of well-known methods as shown in FIG. 7G. While sidewall dielectrics 712al and 712br are shown still present in FIG. 7G, it may be advisable to remove them according to various embodiments. However, according to other embodiments, it might be advisable to allow sidewall dielectrics 712al and 712br to remain.

FIG. 7H depicts device 700 after mask layers 708a, 708b, 710a, and 710b have been removed from the top of the gate stacks 722a and 722b and from the top of structures 734a and 734b, which were previously disposed beneath overhang portions 724a$_1$ and 724b$_1$. As can be seen, where mask layers 708a and 708b previously contacted structures 734a and 734b, substantially flat portions 720a and 720b remain. These substantially flat portions 720a and 720b allow for better contact formation when structures 734a and 734b are used to make select gates. Additionally, according to various embodiments, first gate conductor layers 706a and 706b can be used to make memory gates.

As shown in FIG. 7H, the structures 734a and 734b each have a width associated with their base (wa$_1$ and wb$_1$, respectively). Similarly, the substantially flat portions 720a and 720b have widths associated with them (wa$_g$ and wb$_2$, respectively). According to various embodiments, the widths wa$_2$ and wb$_2$ of the substantially flat portions 720a and 720b may be greater than or equal to half the widths wa$_1$ and wb$_1$ of the bases of structures 734a and 734b. Additionally, as can be seen, the substantially flat top portions 720a and 720b may be substantially co-planer with the tops of additional mask layer 708a and 708b, but extend above first gate conductor layers 706a and 706b.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance. Additionally, it should be understood that none of the examples or explanations contained herein are meant to convey that the described embodiments have been actually reduced to practice.

The breadth and scope of the present invention should not be limited by any of the above-described exemplary embodiments, but should be defined only in accordance with the following claims and their equivalents.

What is claimed is:

1. A method of making a semiconductor device, comprising:
   forming a gate stack on a substrate, wherein the gate stack includes a mask layer disposed over an additional mask layer that is disposed between the mask layer and a first gate conductor layer;
   laterally etching the first gate conductor layer so that an overhanging portion of the mask layer extends beyond the additional mask layer and the first gate conductor layer in a direction parallel to a surface of the substrate;
   forming a sidewall structure layer such that the sidewall structure layer is disposed beneath the overhanging portion of the mask layer; and
   removing the mask layer.

2. The method of claim 1, wherein a dielectric is formed between the gate stack and the substrate.

3. The method of claim 2, further comprising etching a portion of the dielectric disposed beneath the overhanging portion of the mask layer.

4. The method of claim 2, wherein the dielectric comprises a nitride layer and a dielectric layer.

5. The method of claim 1, wherein forming the sidewall dielectric comprises forming the sidewall dielectric such that it extends to a sidewall portion of the additional mask layer that is beneath the overhanging portion of the mask layer.

6. The method of claim 5, wherein the sidewall structure layer is formed such that it is in contact with portions of the sidewall dielectric that are adjacent to the first gate conductor layer and the additional mask layer.

7. The method of claim 1, wherein the sidewall structure layer comprises a dielectric.

8. The method of claim 1, wherein the sidewall structure layer is used to form a select gate.

9. The method of claim 1, further comprising etching the sidewall structure layer.

* * * * *